United States Patent
Dennard et al.

(10) Patent No.: US 7,018,873 B2
(45) Date of Patent: Mar. 28, 2006

(54) METHOD OF MAKING A DEVICE THRESHOLD CONTROL OF FRONT-GATE SILICON-ON-INSULATOR MOSFET USING A SELF-ALIGNED BACK-GATE

(75) Inventors: Robert H. Dennard, New Rochelle, NY (US); Wilfried E. Haensch, Somers, NY (US); Hussein I. Hanafi, Basking Ridge, NJ (US)

(73) Assignee: International Business Machines Corporation, Armonk, NY (US)

( * ) Notice: Subject to any disclaimer, the term of this patent is extended or adjusted under 35 U.S.C. 154(b) by 139 days.

(21) Appl. No.: 10/639,942

(22) Filed: Aug. 13, 2003

(65) Prior Publication Data

US 2005/0037582 A1 Feb. 17, 2005

(51) Int. Cl.
*H01L 21/00* (2006.01)

(52) U.S. Cl. .................. 438/149; 438/311
(58) Field of Classification Search .......... 438/149, 438/174, 176, 180, 184, 185, 197, 199, 201, 438/207, 211, 213, 217, 218, 221, 222, 229–231, 438/233, 260, 265, 276, 289, 294, 296, 299–301, 438/318, 320, 303, 311, 364, 406, 413, 416, 438/181
See application file for complete search history.

(56) References Cited

U.S. PATENT DOCUMENTS

| | | | |
|---|---|---|---|
| 5,273,921 A | * | 12/1993 | Neudeck et al. ............ 438/157 |
| 5,346,839 A | | 9/1994 | Sundaresan |
| 5,773,331 A | * | 6/1998 | Solomon et al. |
| 5,929,479 A | * | 7/1999 | Oyama ...................... 257/315 |
| 6,339,002 B1 | | 1/2002 | Chan et al. |
| 6,342,717 B1 | * | 1/2002 | Komatsu ................... 257/347 |
| 6,496,034 B1 | * | 12/2002 | Forbes et al. ............... 326/41 |
| 6,528,376 B1 | | 3/2003 | Guo |
| 6,541,345 B1 | * | 4/2003 | Komatsu ................... 438/311 |
| 6,580,132 B1 | * | 6/2003 | Chan et al. |
| 6,762,101 B1 | * | 7/2004 | Chan et al. ................ 438/283 |
| 6,946,696 B1 | * | 9/2005 | Chan et al. ................ 257/250 |
| 2004/0119102 A1 | * | 6/2004 | Chan et al. |

FOREIGN PATENT DOCUMENTS

WO    WO 02/101811 A    12/2002

OTHER PUBLICATIONS

Stanley Wolf and Richard N. Tauber, Silicon Processing For The VLSI Era, 1986 Lattice Press, vol. 1, pp. 303–308.*
Stanley Wolf, Silicon Processing For The VLSI Era, 1990, Lattice Press, vol. II, pp. 45–47 and 144–146.*
Guarini K W, et al., "Triple–self aligned, planar double–gate MOSFETs: devices and circuits" International Electron Devices Meeting 2001. IEDM. Technical Digest. Washington, DC, Dec. 2–5, 2001, New York, NY: IEEE, US, Dec. 2, 2001, pp. 1921–1924.

* cited by examiner

*Primary Examiner*—John F. Niebling
*Assistant Examiner*—Stanetta Isaac
(74) *Attorney, Agent, or Firm*—Scully, Scott, Murphy & Presser, P.C.; Wan Yee Cheung, Esq.

(57) ABSTRACT provides SOI CMOS technology whereby a polysilicon back-gate is used to control the threshold voltage of the front-gate device, and the nMOS and pMOS back-gates are switched independently of each other and the front gates. Specifically, the present invention provides a method of fabricating a back-gated fully depleted CMOS device in which the device's back-gate is self-aligned to the device's front-gate as well as the source/drain extension. Such a structure minimizes the capacitance, while enhancing the device and circuit performance. The back-gated fully depleted CMOS device of the present invention is fabricated using existing SIMOX (separation by ion implantation of oxygen) or bonded SOI wafer bonding and thinning, polySi etching, low-pressure chemical vapor deposition and chemical-mechanical polishing.

19 Claims, 12 Drawing Sheets

METHOD OF MAKING A DEVICE THRESHOLD CONTROL OF FRONT-GATE SILICON-ON-INSULATOR MOSFET USING A SELF-ALIGNED BACK-GATE

RELATED APPLICATIONS

This application is related to co-pending and co-assigned U.S. patent application Ser. No. 10/235,169, filed Sep. 5, 2002, U.S. patent application Ser. No. 10/235,147, filed Sep. 5, 2002, and U.S. patent application Ser. No. 09/778,335, filed Feb. 7, 2001.

FIELD OF THE INVENTION

The present invention relates to semiconductor device manufacturing, and more particularly to a method of fabricating a fully depleted complementary metal oxide semiconductor (CMOS) device that includes a back-gate that is self-aligned to the front gate as well as the source/drain extensions.

BACKGROUND OF THE INVENTION

Simultaneous reduction of supply and threshold voltages for low-power silicon-on-insulator (SOI) CMOS designs without suffering performance losses will eventually reach the limit of diminishing returns as static power dissipation becomes a significant portion of the total power equation. In order to meet the opposing requirements of high-performance during circuit/system active periods, and low power during circuit/system idle periods, a dynamic threshold voltage control scheme is needed.

For SOI metal oxide field effect transistors (MOSFETs), there are two modes of operation: 1) fully depleted (FD), and 2) partially depleted (PD) channel region (i.e., body). In conventional strongly fully depleted SOI devices, the silicon film thickness is usually less than or equal to half the depletion width of the bulk device. The surface potentials at the front and back interfaces are strongly coupled to each other and capacitively coupled to the front-gate and substrate through the front-gate dielectric and the buried oxide, respectively. Therefore, the potential throughout the silicon film, and hence the charge, is determined by the bias conditions on both the front-gate and the substrate. By replacing the substrate with a back-gate, the device becomes a dual-gated device.

The fully depleted design is unique to SOI because the front-gate and the back-gate both have control of the charge in the silicon film. In the strongly partially depleted device, the back-gate or the substrate has no influence on the front surface potential. In the middle regime, the device is nominally partially depleted and can become fully depleted by applying bias, thus, coupling of the front and back surface potentials still occurs.

For low power back-gated SOI CMOS operation, back-gate voltages have to be minimized. This will require the use of a back-gate dielectric that has a thickness of about 3 to about 6 nm for sub-50 nm devices. Unfortunately, such a thin back-gate dielectric results in an increase in gate to source/drain capacitance; except if the back-gate structure is made self-aligned to the front gate and the source/drain extensions, hence minimizing this capacitance, which in turn, enhances the device and circuit performance.

To date, no adequate means is provided that can fabricate back-gated fully depleted CMOS devices in which the back-gate is self-aligned to the device front-gate as well as the source/drain extensions. In view of the state of the art mentioned above, there is a continued need for providing an SOI MOSFET device that includes such self-alignment between the back-gate, front-gate and source/drain extensions.

SUMMARY OF THE INVENTION

The present invention provides SOI CMOS technology whereby a polysilicon, i.e., polySi, back-gate is used to control the threshold voltage of the front-gate device, and the nMOS and pMOS back-gates are switched independently of each other and the front gates. Specifically, the present invention provides a method of fabricating a back-gated fully depleted CMOS device in which the device's back-gate is self-aligned to the device's front-gate as well as the source/drain extensions. Such a structure minimizes the capacitance, while enhancing the device and circuit performance.

The back-gated fully depleted CMOS device of the present invention is fabricated using SIMOX (separation by ion implantation of oxygen) or bonded SOI wafers, wafer bonding and thinning, polySi etching, low-pressure chemical vapor deposition and chemical-mechanical polishing.

Specifically, the method of the present invention comprises the steps of:

providing a structure comprising a carrier wafer, an oxide layer positioned on the carrier wafer, a polySi back-gate located on the oxide layer, a back-gate dielectric located on said polySi back-gate, and a Si-containing layer located on said back-gate dielectric;

forming a channel region into a portion of said Si-containing layer;

forming a front gate region comprising a front-gate dielectric, a front polySi gate and sacrificial spacers atop said channel region;

forming undercutting shallow trench isolation regions in said structure;

removing the sacrificial spacers and forming source/drain extensions into the channel region; and forming gate spacers atop the top of the channel region and source/drain regions in said channel region, wherein said polySi back-gate is self-aligned with the front polySi gate and the source/drain extensions.

DETAILED DESCRIPTION OF THE INVENTION

Figure 1:
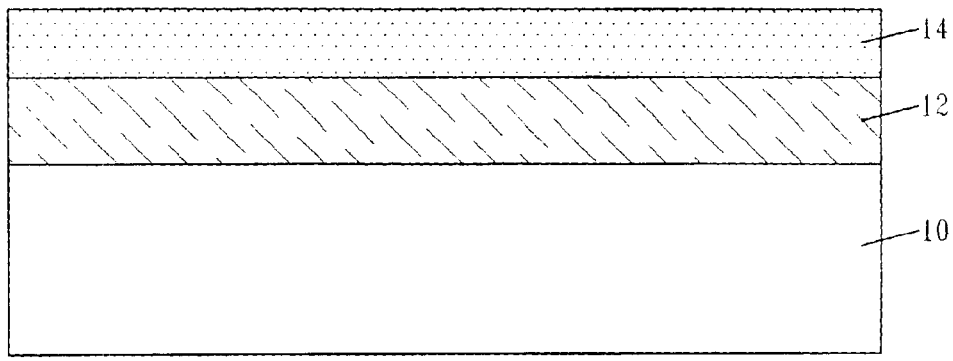
FIG. 1 is a pictorial representation (through a cross-sectional view) illustrating a starting SOI wafer that can be employed in the present invention.

The present invention, which provides a method of fabricating a back-gated fully depleted CMOS device in which the back-gate controls the threshold voltage of the front-gate, will now be described in greater detail by referring to the drawings that accompany the present application. In the accompanying drawings, like and/or corresponding elements are referred to by like reference numerals.

FIG. 1 illustrates an initial SOI substrate that can be employed in the present invention. The terms "SOI substrate" and "SOI wafer" are used interchangeably in the present application. Specifically, the initial SOI substrate or wafer of FIG. 1 comprises buried oxide layer 12 that electrically isolates Si-containing substrate 10 from Si-containing layer 14. Si-containing layer 14 is the SOI layer in which active device regions can be formed therein. The term "Si-containing" as used herein denotes a semiconductor material that includes at least silicon. Illustrative examples of such Si-containing semiconductor materials include, but are not limited to: Si, SiGe, SiC, SiGeC, Si/Si, Si/SiC or Si/SiGeC. Buried oxide region 12 may be a continuous buried oxide region, as is shown in FIG. 1, or it may be a non-continuous, i.e., patterned, buried oxide region (not shown). The non-continuous buried oxide regions are discrete and isolated regions or islands that are surrounded by Si-containing layers, i.e., layers 10 and 14.

At this point of the present invention, the Si-containing layer 14 is lightly doped with an N or P-type dopant. The term "lightly doped" is used herein to denote a dopant concentration of about 1E14 to about 5E15 atoms/cm$^3$, with a dopant concentration of about 2E15 atoms/cm$^3$ being more highly preferred.

The SOI substrate may be formed utilizing conventional SIMOX (separation by ion implantation of oxygen) processes well-known to those skilled in the art, as well as the various SIMOX processes mentioned in co-assigned U.S. patent applications Ser. No. 09/861,593, filed May 21, 2001; Ser. No. 09/861,594, filed May 21, 2001; Ser. No. 09/861,590, filed May 21, 2001; Ser. No. 09/861,596, filed May 21, 2001; and Ser. No. 09/884,670, filed Jun. 19, 2001 as well as U.S. Pat. No. 5,930,634 to Sadana, et al., the entire contents of each are incorporated herein by reference. Alternatively, the SOI substrate material may be made using other conventional processes including, for example, a thermal bonding and cutting process.

In addition to the above techniques, the initial SOI substrate employed in the present invention may be formed by deposition processes as well as lithography and etching (employed when fabricating a patterned substrate). Specifically, the initial structure may be formed by depositing an oxide film atop a surface of a Si-containing substrate, via a conventional deposition or thermal growing process; optionally patterning the oxide film by employing conventional lithography and etching; and thereafter forming a Si-containing layer atop the oxide layer using a conventional deposition process including, for example, chemical vapor deposition (CVD), plasma-assisted CVD, sputtering, evaporation, chemical solution deposition or epitaxial Si growth.

The thickness of the various layers of the initial SOI substrate may vary depending on the process used in making the same. Typically, however, Si-containing layer 14 has a thickness of from about 100 to about 200 nm. In the case of buried oxide layer 12, that layer may have a thickness of from about 100 to about 400 nm. The thickness of the Si-containing substrate layer, i.e., layer 10, is inconsequential to the present invention. It is noted that the thickness ranges provided above are exemplary and by no ways limit the scope of the present invention.

Figure 2:
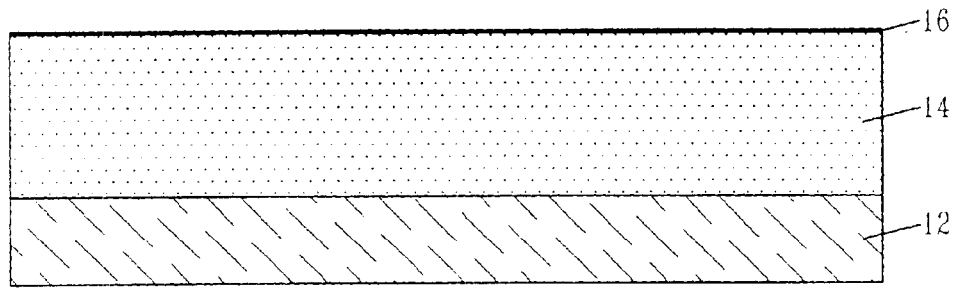
FIG. 2 is a pictorial representation (through a cross-sectional view) illustrating the structure of FIG. 1 after a back-gate dielectric is formed on an upper surface of the SOI substrate.
Figure 7:
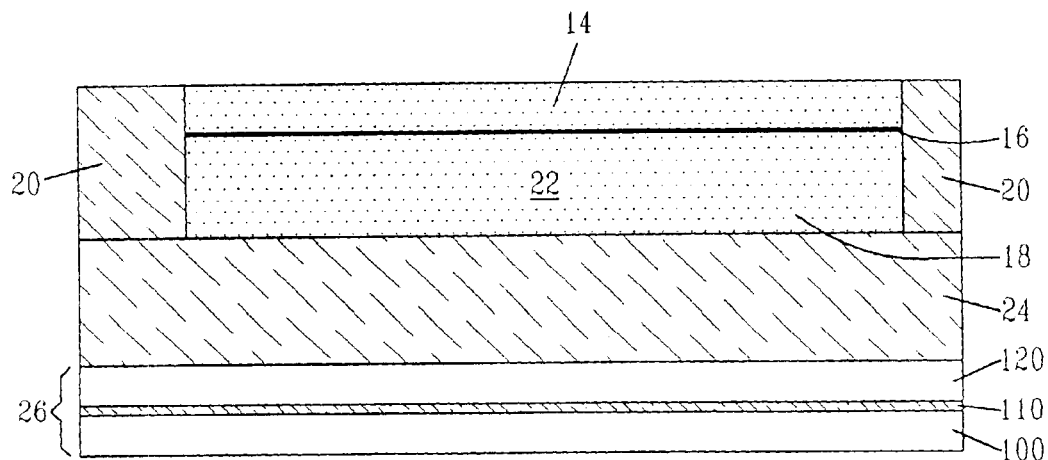
FIG. 7 is a pictorial representation (through a cross-sectional view) illustrating the structure that is formed after polishing, oxidation and etching.

Next, a back-gate dielectric 16 is formed on a surface of Si-containing layer 14 utilizing a conventional thermal growing process. Alternatively, the back-gate dielectric 16 may be formed by a conventional deposition process including, but not limited to: chemical vapor deposition (CVD), plasma-assisted CVD, chemical solution deposition, sputtering and evaporation. The back-gate dielectric 16 may include an oxide, nitride and/or an oxynitride, with preference given to oxides. The thickness of the back-gate dielectric 16 may vary depending on the technique used in fabricating the same. Typically, however, back-gate dielectric 16 has a thickness of from about 1 to about 10 nm. The resultant structure including the back-gate dielectric 16 is shown, for example, in FIG. 2. In FIG. 2, as well as the remaining drawings, Si-containing substrate 10 of the initial SOI wafer has been omitted for clarity, the exception is when the Si-containing substrate 10 is removed as is the case in FIG. 7. The Si-containing substrate 10 is intended to be present however in each of FIGS. 2–6. The thickness of layer 14 illustrated in FIG. 2 has been shown to be thicker than the original thickness of layer 14 in FIG. 1 for clarity.

In accordance with the next step of the present invention, a polySi layer 18 is formed on an upper exposed surface of the back-gate dielectric 16 utilizing a low-pressure chemical vapor deposition (LPCVD). The term "low pressure" is used herein to denote a CVD process that is performed at a pressure of about 5 Torr or below. The polySi layer 18 formed may have any thickness, but typically the polySi layer 18 has a thickness of from about 100 to about 200 nm. The resultant structure including the polySi layer 18 is shown, for example, in FIG. 3. In some embodiments of the present invention, an optional pad nitride (not shown) may be formed on the polySi layer 18 at this point of the present invention.

Figure 3:
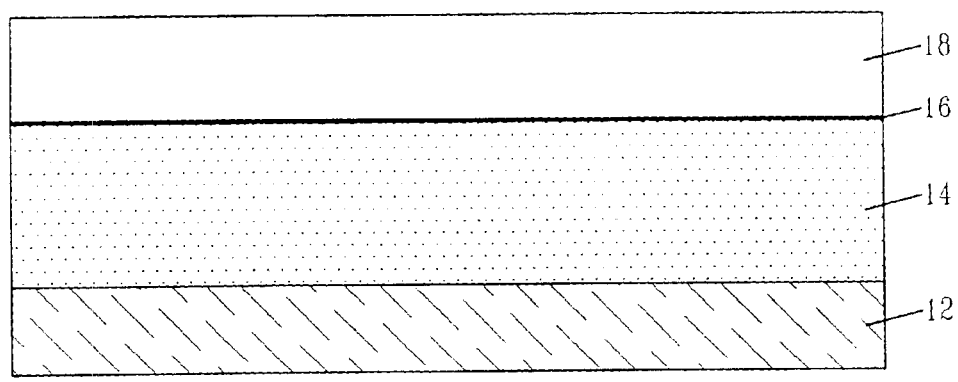
FIG. 3 is a pictorial representation (through a cross-sectional view) illustrating the structure of FIG. 2 including a polySi layer formed on the back-gate dielectric.
Figure 4:
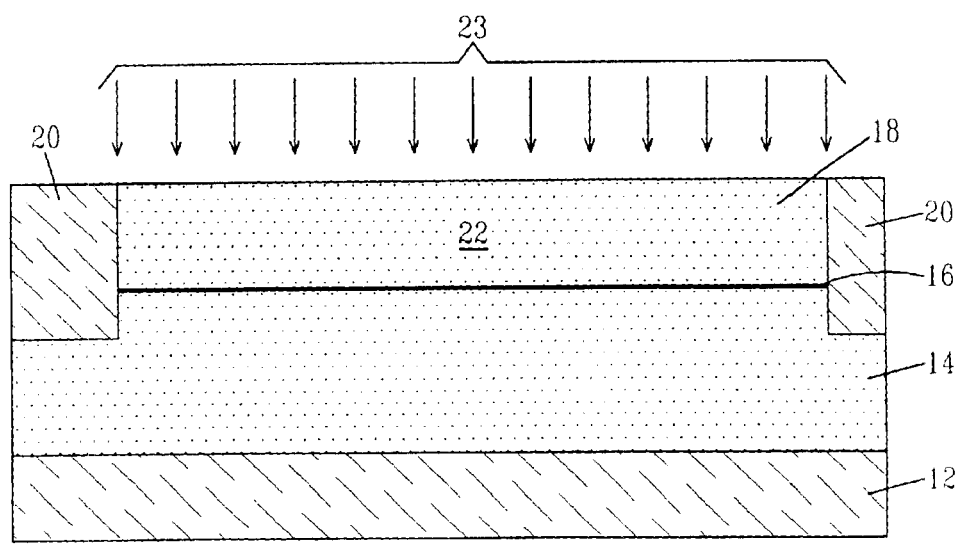
FIG. 4 is a pictorial representation (through a cross-sectional view) illustrating the structure after formation of isolation regions and back-gate implantation and annealing.

FIG. 4 shows the structure that is formed after deep trench isolation regions 20 are formed into the structure shown in FIG. 3. As shown, the deep trench isolation regions 20 are formed through polySi layer 18 and back-gate dielectric 16, stopping on, or in, the Si-containing layer 14. It is noted that the actual number of deep trench isolation regions may exceed the number shown in the drawings.

The deep trench isolation regions 20 are formed by utilizing conventional lithography and etching. The lithography step used in forming the trenches of the isolation regions comprises the steps of: applying a photoresist (not shown) to the exposed surface of polySi layer 18 (or optional pad nitride), exposing the photoresist to a pattern of radiation, and developing the pattern into the exposed photoresist utilizing a conventional resist developer. The etching step, which may be conducted in a single step or multiple etching steps, includes the use of a conventional dry etching process such as reactive-ion etching, plasma etching or ion beam etching; chemical wet etching; or a combination thereof. The etching step forms deep trenches into the structure that will be subsequently filled with an insulating material. The deep trench isolation regions 20 typically have a trench depth of about 140 nm or greater.

After the deep trenches have been formed, the structure is subjected to an optional oxidation process, which forms a thin liner (not separately labeled) on the exposed trench sidewalls that are composed of a Si-containing material. The trenches (with or without the liner) are filled with a dielectric material such as TEOS (tetraethylorthosilicate) utilizing a conventional deposition process such as CVD or plasma-assisted CVD and thereafter the structure is planarized utilizing a conventional planarization process such as chemical-mechanical polishing (CMP) or grinding, stopping on the upper surface of either the optional pad nitride or the polySi layer 18. An optional densification step may be performed after filling the trench, but prior to planarization. In instances in which the pad nitride is present, the optional pad nitride is removed at this point of the present invention utilizing a chemical etchant such as hot phosphoric acid FIG. 4 also shows the presence of back-gate 22, which is located in a portion of the polySi layer 18 that is located between two neighboring deep trench isolation regions. The back-gate 22 is formed by ion implanting and annealing. For NMOS devices, the back-gate 22 is formed by ion implanting an N, or more preferably a P type dopant into the polySi layer. For PMOS devices, P, or more preferably N type dopants are ion implanted into the polySi layer 18.

The ion implantation (represented by arrows 23 in FIG. 4) is performed utilizing conventional techniques well-known to those skilled in the art, whereas annealing is performed under conditions that will diffuse and activate the dopant regions. Specifically, annealing is conducted in an inert gas ambient such as Ar, $N_2$ or He at a temperature of about 800° C. or greater for a time period of about 5 seconds or greater.

Figure 5:
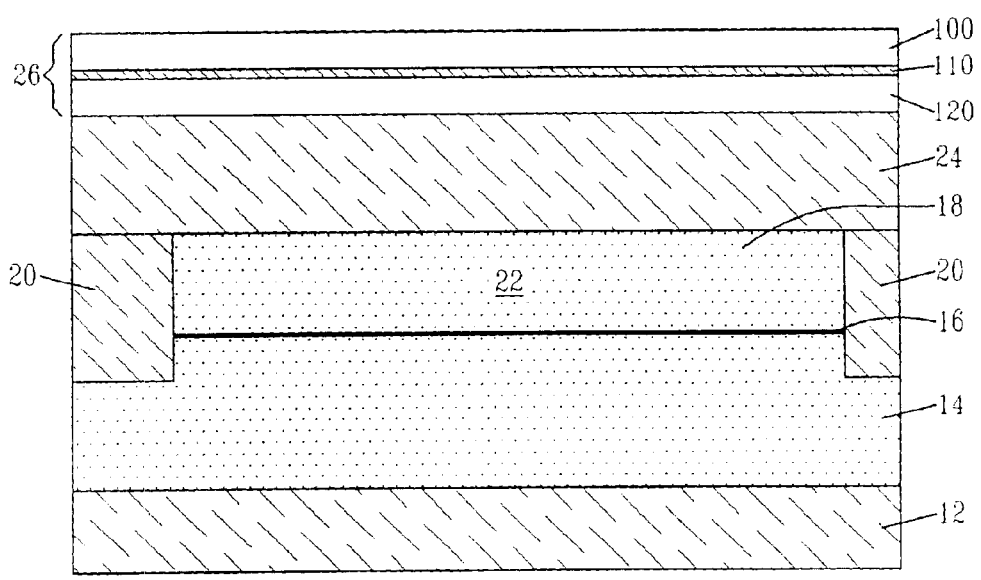
FIG. 5 is a pictorial representation (through a cross-sectional view) illustrating the bonding of a holding (or carrier) wafer to the structure shown in FIG. 4.
Figure 6:
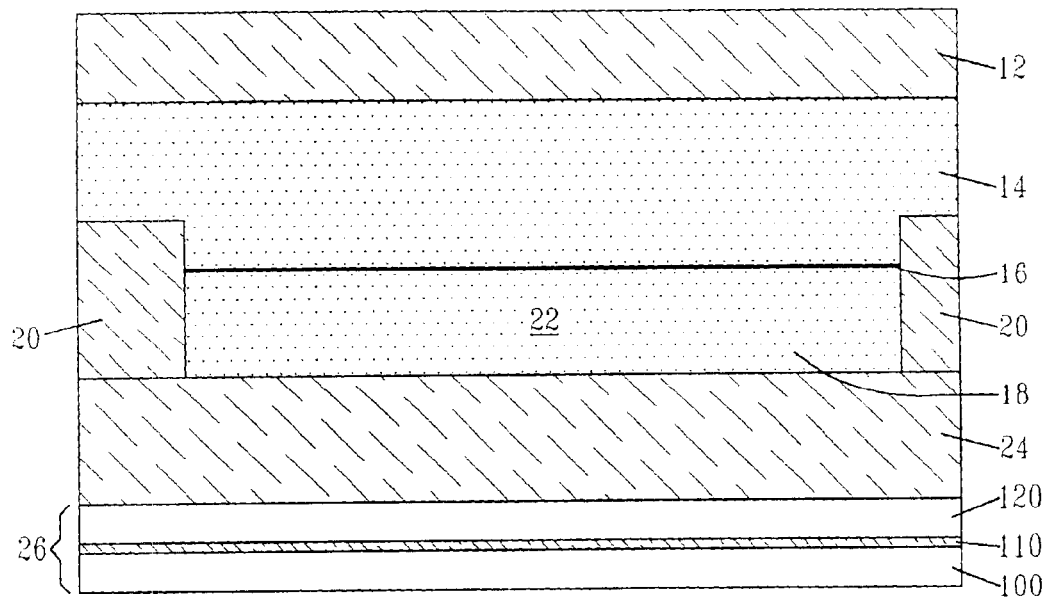
FIG. 6 is a pictorial representation (through a cross-sectional view) illustrating the structure of FIG. 5 after performing a top to bottom flipping step.

FIG. 5 illustrates the structure that is formed after oxide layer 24 is formed on the upper surface of the structure shown in FIG. 4, including the deep trench isolation regions 20 and the polySi layer 18 (now back-gate 22), and a handling (or carrier) wafer 26 has been bonded to the upper surface of the previously formed oxide layer 24.

The oxide layer 24 is typically a TEOS layer that is formed by a conventional deposition process such as CVD or plasma-assisted CVD. The thickness of oxide layer 24 may vary depending on the conditions and length of the deposition process. Typically, however, the oxide layer 24 has a thickness of from about 150 to about 250 nm.

The handling wafer 26 (which can be a second SOI wafer) comprises a Si-containing substrate 100, oxide layer 110, and a Si-containing layer 120. Alternatively, the handling wafer 26 may be a bulk semiconductor substrate or wafer. The term "Si-containing" has the same meaning as indicated above. In accordance with the method of the present invention, the handling wafer is positioned such that Si-containing layer 120 is facing the previously deposited oxide layer 24. After positioning the handling wafer 26, the two structures are brought into contact with each other and then they are bonded together.

In one embodiment, the bonding step of the present invention includes heating the two wafers at a temperature of from about 900° to about 1100° C. for a time period of from about 1.5 hours to about 2.5 hours. In one preferred embodiment of the present invention, the wafers are bonded together at a temperature of about 1050° C. for a time period of about 2 hours.

In another embodiment of the present invention, the bonding step is performed utilizing the room-temperature bonding process described in co-assigned U.S. application Ser. No. 10/202,329, filed Jul. 24, 2002, the entire content of which is incorporated herein by reference. The term "room temperature bonding process" denotes a bonding process that is carried out at a temperature of from about 18° to about 27° C., with a temperature of from about 20° to about 25° C. being more highly preferred. The room temperature bonding process is typically carried out in an inert ambient such as He, $N_2$ or Ar and an external force may be applied to the structure to aide in the bonding process. Following the bonding of the two wafers, the structure shown in FIG. 5 is flipped, top to bottom, providing the structure shown, for example, in FIG. 6.

Next, the Si-containing substrate 10 and buried oxide region 12 of the initial wafer are removed, stopping on a surface of Si-containing layer 14. The Si-containing layer 14 is then planarized stopping on the surface of deep trench isolation region 20. The resultant structure that is formed after these steps have been performed is shown, for example, in FIG. 7. Specifically, the removal of the Si-containing substrate 10 and the buried oxide layer 12 of the initial wafer are achieved utilizing conventional processes that are well-known in the art. For example, Si-containing substrate 10 and buried oxide layer 12 of the initial wafer may be removed utilizing a single polishing step such as CMP or grinding, or alternatively, the various layers are removed utilizing distinct and separate removal processing steps. The use of distinct, and separate removal processes is preferred herein since it provides for more selectively and ensures that the removal process stops on Si-containing layer 14.

When distinct, and separate removal processes are employed in the present invention, Si-containing substrate 10 of the initial wafer is first removed, stopping on buried oxide layer 12, by utilizing a CMP process which has a high selectivity for removing a Si-containing material as compared with oxide. Next, an oxidation process may optionally be performed to ensure that only oxide remains on the exposed surface of the bonded wafer. After removal of Si-containing substrate 10, and optionally performing the oxidation step, a conventional chemical wet etching process that has a high-selectivity for removing oxide as compared to Si-containing material is employed. For example, an HF etching process can be employed in the present invention for removing buried oxide layer 12 from the bonded structure. Note that the various removal processes expose Si-containing layer 14 of the initial wafer. The Si-containing layer 14 is then thinned by performing a planarization process such as CMP. The thickness of the Si-containing layer 14 after the planarization process has been performed is about 25 nm or less.

Figure 8:
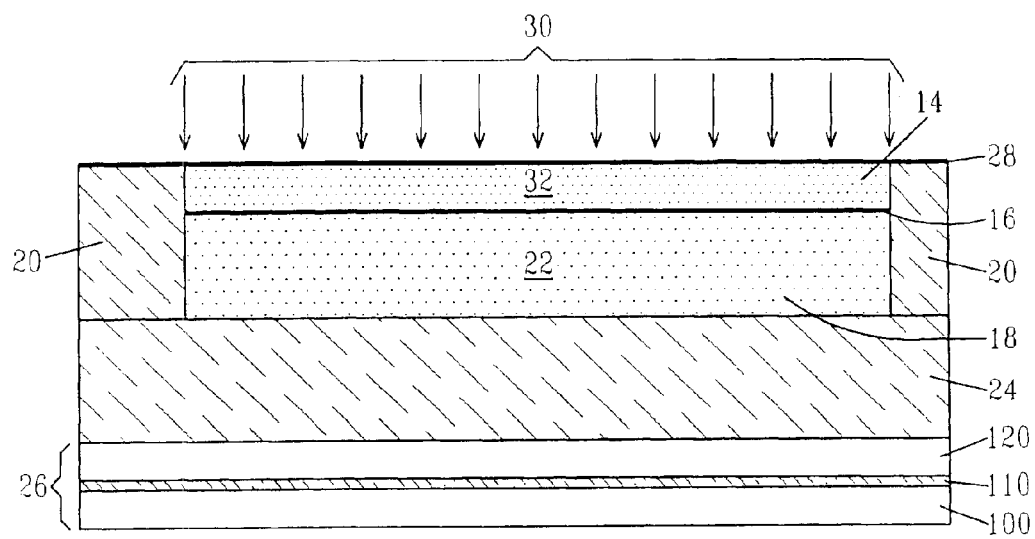
FIG. 8 is a pictorial representation (through a cross-sectional view) illustrating the structure that is formed after device channel, i.e., body, implantation and annealing.

FIG. 8 shows the resultant structure that is formed after sacrificial oxide layer 28 is formed atop the exposed surface of Si-containing layer 14 and deep trench regions 20. The sacrificial oxide layer 28 can be formed by a thermal oxidation process, or alternatively sacrificial oxide layer 28 can be formed by a conventional deposition process such as CVD or plasma-assisted CVD. The thickness of the sacrificial oxide layer 28 is not critical to the present invention, but typically, the sacrificial oxide layer 28 has a thickness of from about 3 to about 10 nm.

At this point of the present invention (see, FIG. 8), ions 30 (either N- or P-type) are typically implanted into portions of Si-containing layer 14. The type of ion being implanted is dependent on the type of device being formed. B is typically employed as the N-type dopant, while P or As are employed as the P-type dopant. The region where ions 30 are implanted becomes the body, i.e., device channel, 32 of the device. A masked ion implantation process utilizing standard implantation conditions is employed in forming body 32. Following body implantation, a conventional annealing process which is conducted in an inert ambient is performed to activate the dopants within the body 32. Although various annealing temperatures and times may be employed in the present invention in activating the dopants within the body 32, it is preferred to anneal in Ar at a temperature of about 1000° C. for about 5 seconds.

Figure 9:
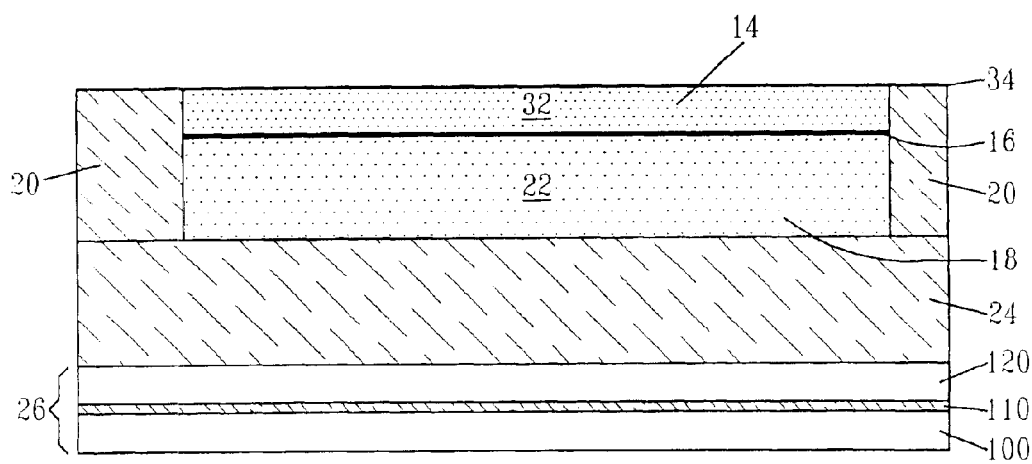
FIG. 9 is a pictorial representation (through a cross-sectional view) illustrating the structure after formation of the front gate dielectric.

FIG. 9 shows the structure that is formed after removing sacrificial oxide layer 28 from the structure so as to expose underlying body 32, i.e., Si-containing layer 14, and formation of front-gate dielectric 34. Specifically, the sacrificial oxide layer 28 is removed from the structure utilizing a conventional wet etching process wherein a chemical etchant that is highly selective in removing an oxide is employed. For example, HF can be used to remove the sacrificial oxide layer from the structure.

Next, gate dielectric 34 is formed on at least the exposed Si-containing surface, which includes body 32. Gate dielectric 34 is formed on the exposed surfaces of body 32 as well as Si-containing layer 14 utilizing a conventional thermal growing process. The gate dielectric 34, which serves as the front-gate dielectric, is a thin layer having a thickness of from about 1 to about 5 nm. The gate dielectric 34 may be composed of a conventional oxide such as, but not limited to: $SiO_2$, $Al_2O_3$, $Ta_2O_5$, $TiO_2$, and perovskite-type oxides.

Figure 10:
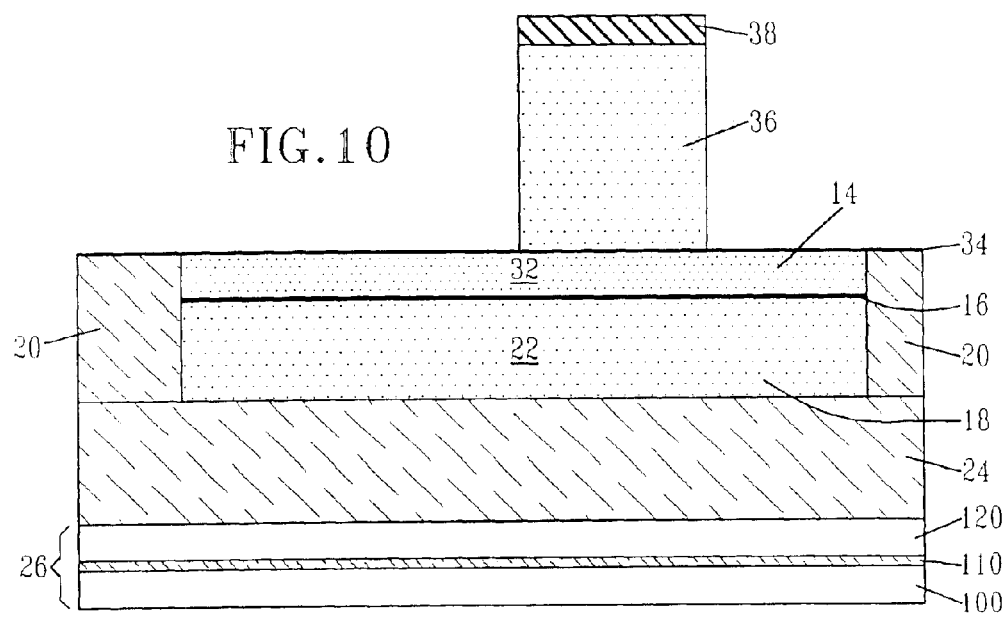
FIG. 10 is a pictorial representation (through a cross-sectional view) illustrating the structure after formation of the polySi gate conductor.

Following formation of the gate dielectric 34, polysilicon gate 36 (which functions as the front-side gate) is formed over the gate dielectric 34 that overlays body 32, see FIG. 10. The polySi gate 36, which is composed of doped polysilicon, is formed by first depositing polysilicon atop the gate dielectric utilizing a conventional deposition process and then lithography and etching is used in forming the final gate structure. The polysilicon is either doped in-situ during the deposition process, or alternatively, the polysilicon gate can be doped after deposition using conventional ion implantation and annealing. In some embodiments of the present invention, the polysilicon gate doping can be delayed until formation of the source/drain regions. In FIG. 10, there is shown an embodiment where a hardmask 38 comprised of a nitride or oxynitride is formed on a top surface of the polysilicon gate 36 prior to the patterning step.

The polysilicon gate 36 is then subjected to a gate re-oxidation process which is capable of forming oxide liner 40 about the gate's vertical sidewalls and on its top horizontal surface, if hardmask 38 is not present. The re-oxidation is performed in an oxidizing ambient such as $O_2$ or air at a temperature of about 800° C. or greater for a time period of about 5 minutes or less.

Next, sacrificial spacers 42 are formed about each of the sidewalls of the polySi gate 36 utilizing conventional deposition and etching. Sacrificial spacers 42 comprise a nitride, oxynitride or a combination thereof. The resultant structure including sacrificial spacers 42 is shown, for example, in FIG. 11. The sacrificial spacers 42 are wide spacers having a width of from about 50 to about 100 nm, as measured at the bottom. Wide spacers are required to prevent too much undercut in the next step of the present invention. The sacrificial spacers 42 are thicker than the gate spacers to be formed later.

Figure 11:
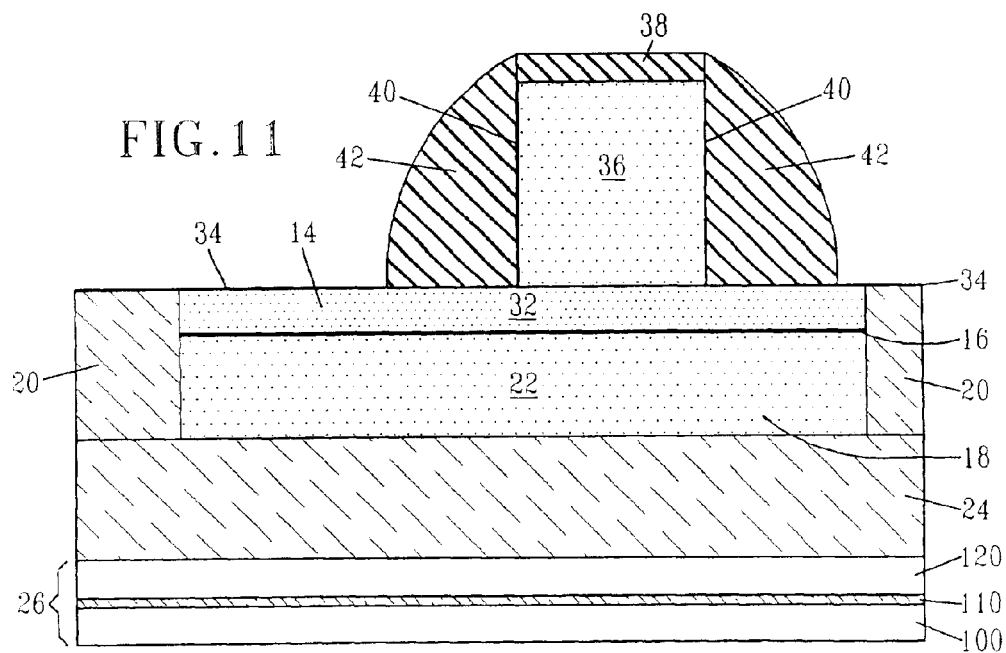
FIG. 11 is a pictorial representation (through a cross-sectional view) illustrating the structure after sacrificial spacer formation
Figure 12:
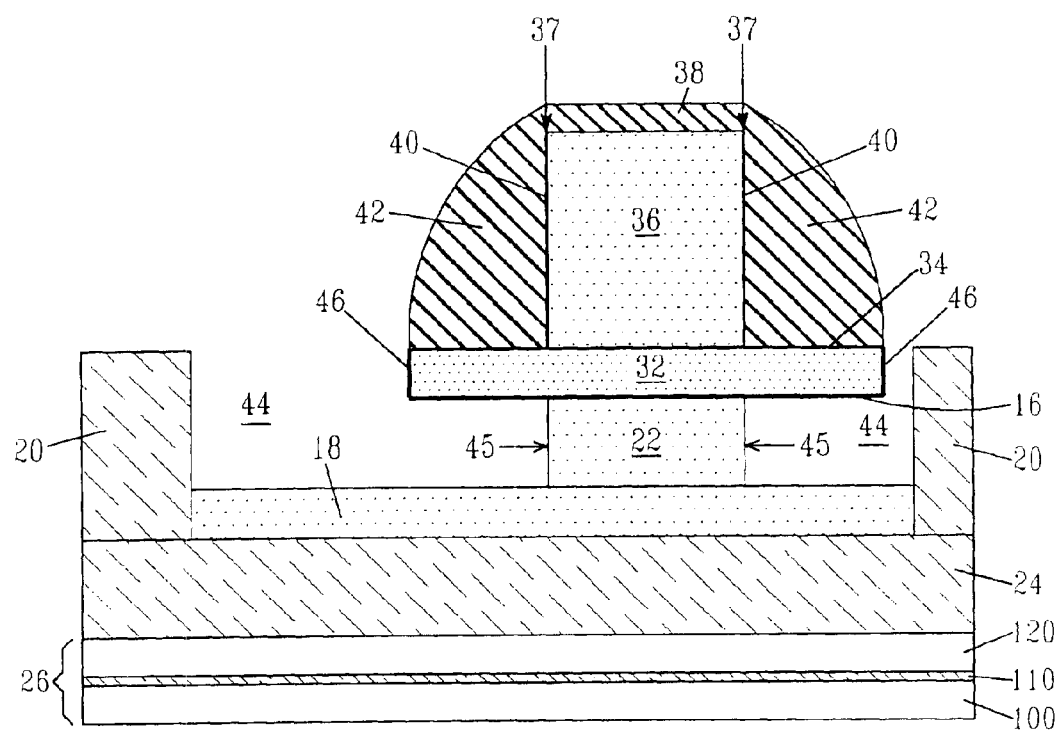
FIG. 12 is a pictorial representation (through a cross-sectional view) illustrating the structure after formation of shallow trenches.

Next, shallow trenches 44 are formed into the structure shown in FIG. 11 utilizing the following technique. The resultant structure including shallow trenches 44 is shown, for example, in FIG. 12. Note that at least one of the edges 45 of the shallow trenches 44 is aligned with one of the edges 37 of the previously formed polySi gate 36. Note also that back-gate 22 is also self-aligned with the edge 37 of polySi gate 36. Specifically, the structure shown in FIG. 12 is formed by first removing, via an chemical etching step, portions of gate dielectric 34 that are not protected with sacrificial spacers 42 and polySi gate 36. The chemical etching step utilizes a chemical etchant such as diluted hydrofluoric acid that selectively removes exposed portions of the gate dielectric 34. This etching step exposes the underlying Si-containing layer 14.

The exposed portions of Si-containing layer 14 are then subjected to a timed isotropic reactive-ion etching (RIE) step wherein a chemical etchant that is capable of stopping on the back-gate dielectric 16 is employed. Next, exposed sidewall portions of the body 32 are subjected to a rapid thermal oxidation process. The rapid thermal oxidation process is typically carried out at a temperature of about 800° C. for a time period of about 5 to about 10 seconds. The rapid thermal oxidation process forms a thin (on the order of about 4 nm or less) oxide film 46 in and on the sidewalls of body 32. A second timed isotropic RIE or a timed KOH wet etch is then performed to complete the undercut and formation of shallow trenches 44. The shallow trenches 44 have a depth, as measured from a top surface of the structure, of about 50 nm or less.

Figure 13:
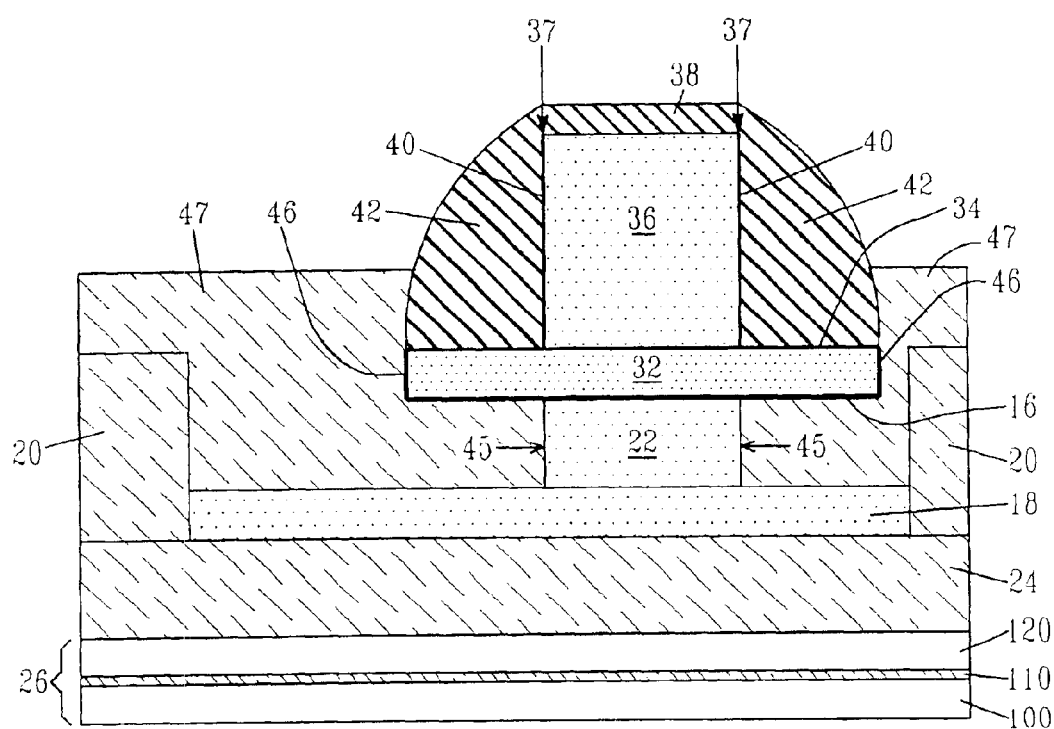
FIG. 13 is a pictorial representation (through a cross-sectional view) illustrating the structure after trench fill, planarization and recessing.

Following formation of shallow trenches 44, the shallow trenches 44 are filled with a trench dielectric material such as TEOS and then the structure is planarized and recessed. The resultant structure formed after these processing steps have been performed is shown, for example, in FIG. 13. In FIG. 13, reference numeral 47 refers to the shallow trench isolation regions formed in the present invention.

Figure 14:
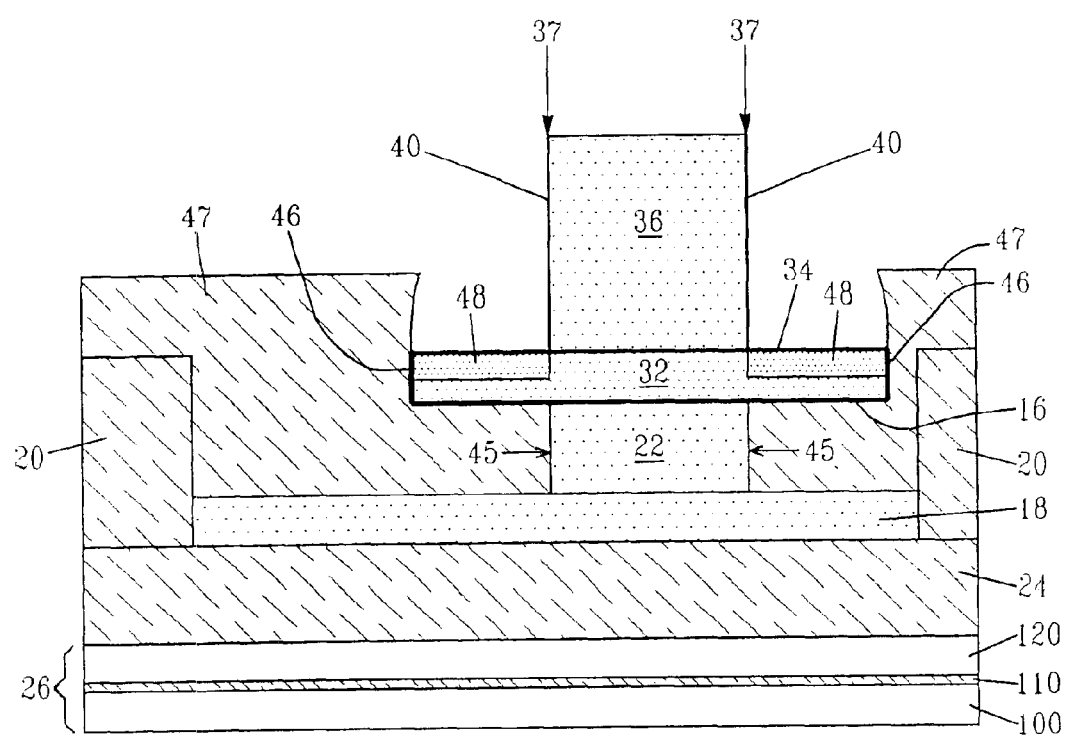
FIG. 14 is a pictorial representation (through a cross-sectional view) illustrating the structure after sacrificial spacer removal, source-drain extension and optional halo implantations and annealing.

The sacrificial spacers 42 (and, if present, optional hardmask 38) are then removed from the structure shown in FIG. 13 using a chemical etchant such as hot phosphoric acid that selectively removes the sacrificial spacers 42 (and, if present, the optional hardmask 38) from the structure. Following the removal of the sacrificial spacers 42, source/drain extensions 48 are formed in the body 32 utilizing conventional ion implantation and annealing. An optional halo implant region, not shown, may also be formed. Although annealing may be conducted utilizing various conditions, it is preferred to anneal the source/drain extension implants in Ar at a temperature of about 900° C. for a time period of 5 seconds. The resultant structure after sacrificial spacer 42 removal and source/drain extensions 48 and optional halo formation is shown, for example, in FIG. 14. Note that spacers 48 are self-aligned to edges of both the front and back gate.

Figure 15:
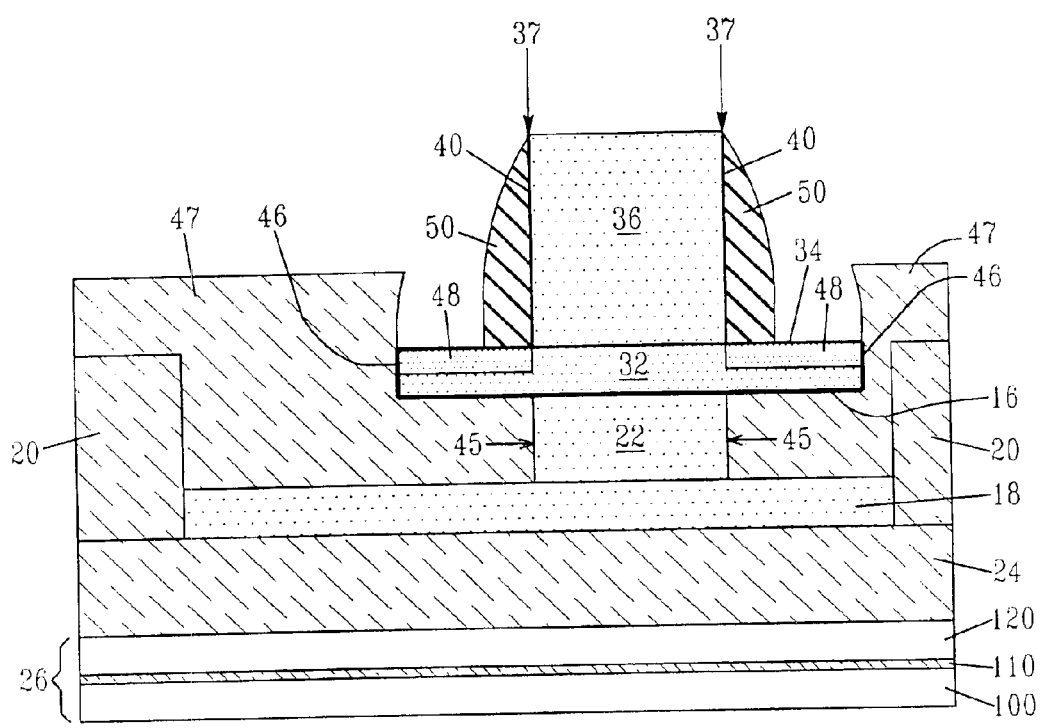
FIG. 15 is a pictorial representation (through a cross-sectional view) illustrating the structure after formation of the gate spacers abutting the polySi gate.

Spacers 50 which may be composed of a nitride, oxynitride or a combination thereof, are then formed about the vertical sidewalls of the polysilicon gate 36. The spacers 50 are formed by deposition of an insulating material followed by etching. FIG. 15 shows the resultant structure having spacers 50 formed about the vertical sidewalls of the polysilicon gate 36.

After spacer formation, source/drain regions 52 (see, FIG. 16) are formed into the body 32 abutting each spacer 50 utilizing a conventional ion implantation and annealing process. Because the source/drain extensions 48 form part of the source/drain regions 52, one can also say that the source/drain regions 52 are self-aligned to the back-gate 22 as well as the front gate, i.e., polySi gate 36. Although various annealing conditions can again be employed, it is preferred to conduct the annealing in Ar at a temperature of about 1000° C. for a time period of about 5 seconds.

Figure 16:
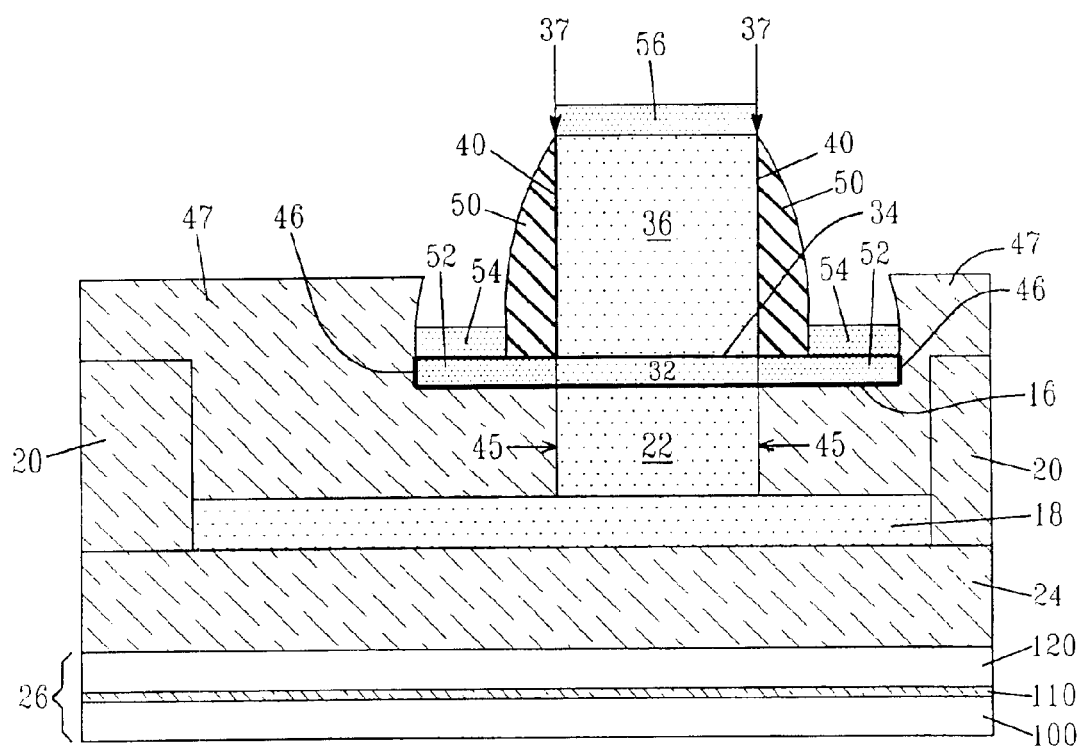
FIG. 16 is a pictorial representation (through a cross-sectional view) illustrating the structure after source/drain formation and raised source/drain formation.

Raised source/drain regions 54, as depicted in FIG. 16, are formed on the surfaces of source/drain regions 52 utilizing conventional processes well-known to those skilled in the art. Specifically, the exposed surfaces of the source/drain regions 52 are first cleaned utilizing a HF dip or other related process. After the cleaning step, the raised/source drain regions 54 are formed by depositing a layer of epi polysilicon or Si on the exposed source/drain regions, and doping the thus deposited epi Si or Si layer by ion implanting and annealing. Note that a layer of epi Si or Si (denoted by reference numeral 56) is formed atop the polySi gate 36.

Figure 17:
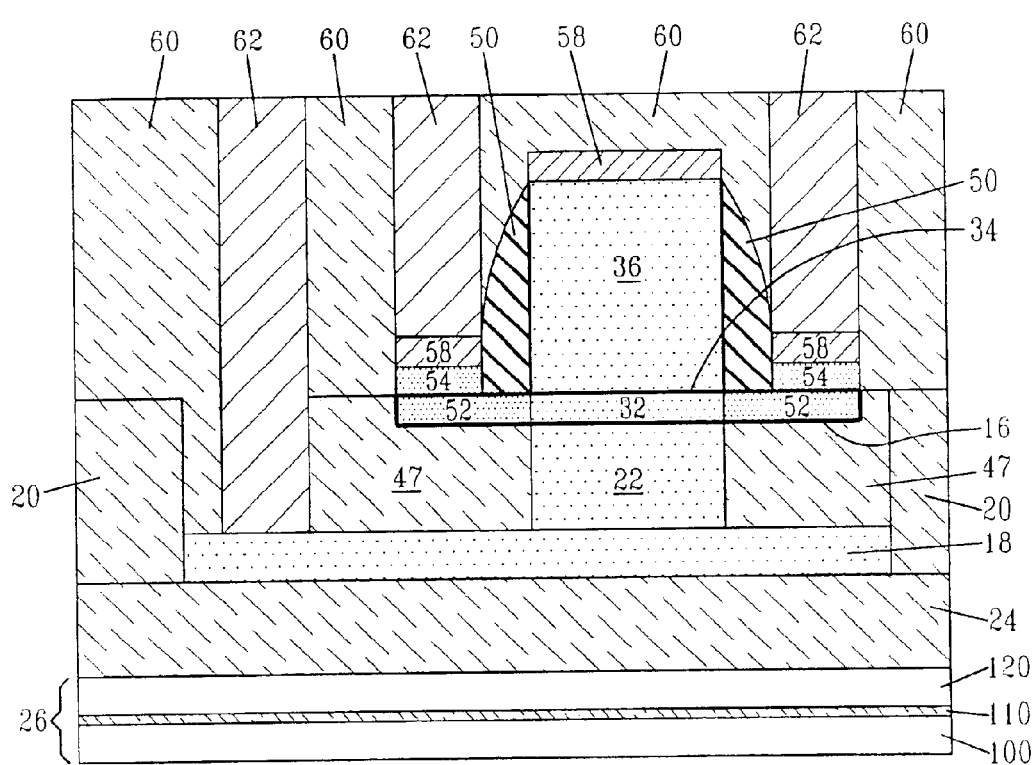
FIG. 17 is a pictorial representation (through a cross-sectional view) illustrating the final structure of the present invention after performing silicidation, dielectric deposition, and contact formation.

Next, and as shown in FIG. 17, conventional BEOL processing steps may be performed so as contact the device shown in FIG. 16 to external devices and/or other devices that may be present in the structure. Included in the BEOL processing steps is converting a portion of the raised source/drain regions 54 and layer 56 atop the gate into silicide regions 58 by utilizing a conventional salicidation process; forming a layer of insulating material 60 such as BPSG (boron doped phosphorus silicate glass) by deposition and planarizing the same; providing contact openings into insulating layer 60 by lithography and etching; and filling the contact holes with conductive material 62. The conductive material employed includes, but is not limited to: Cu, Al, W, polysilicon and other like conductive materials. Note that the contact region that extends to the surface of the back-gate is the back-gate contact, while the contact regions which extend to the source/drain regions are referred to as S/D contacts.

In the structures shown in FIGS. 15, 16 and 17, polySi back-gate 22 is capable of controlling the threshold voltage of the front-gate, i.e., polysilicon gate 36, because the surface potentials at the front and back interfaces are strongly coupled to each other and capacitively coupled to the front and back-gate dielectrics, respectively. Therefore, the potential through the silicon film, and hence the charge, is determined by the bias conditions on both the front and back-gates. In other words, the implanted back-gate controls the threshold voltage of the front-gate device.

It is noted that the present invention can be used to form a plurality if fully depleted CMOS devices on a single substrate. Each of the fully depleted CMOS devices would have the characteristics mentioned above.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to exact forms and details described and illustrated but fall within the scope of the appended claims.

Having thus described our invention in detail, what we claim as new and desire to secure by the Letters Patent is:

1. A method of fabricating a semiconductor device comprising the steps of:

providing a structure comprising a carrier wafer, an oxide layer positioned on the carrier wafer, a polySi back-gate located on the oxide layer, a back-gate dielectric located on said polySi back-gate, and a Si-containing layer located on said back-gate dielectric;

forming a channel region into a portion of said Si-containing layer;

forming a front gate region comprising a front-gate dielectric, a front polySi gate and sacrificial spacers atop said channel region;

forming undercutting shallow trench isolation regions in said structure, wherein during said forming of said undercutting shallow trench isolation regions the back-gate is etched to a length which is less than a length of the overlying Si-containing layer, yet aligned to a lateral edge of said front polySi gate;

removing the sacrificial spacers and forming source/drain extensions into the channel region; and forming gate spacers atop the top of the channel region and source/drain regions in said channel region, wherein said polySi back-gate is self-aligned with the front polySi gate and the source/drain extensions.

2. The method of claim 1 wherein said polySi back-gate is formed by implanting dopants into a polySi layer that is formed atop the back-gate dielectric and annealing the implanted dopants.

3. The method of claim 1 wherein said back-gate dielectric is formed on the Si-containing layer of an initial silicon-on-insulator (SOI) substrate by a thermal growing process or deposition.

4. The method of claim 1 wherein said structure further includes deep trench isolation regions, each deep trench isolation region having an upper surface that is coplanar with an upper surface of the Si-containing layer.

5. The method of claim 1 wherein said Si-containing layer of said structure is thinned by a planarization process.

6. The method of claim 1 wherein said structure is formed by positioning said carrier wafer to be in contact with said oxide layer and performing a bonding step.

7. The method of claim 6 wherein bonding step comprises heating at a temperature of from about 900° to about 1100° C. for a time period of about 1.5 hours to about 2.5 hours.

8. The method of claim 6 wherein said bonding step is performed at a temperature of from about 18° to about 27° C. in the presence of an inert ambient.

9. The method of claim 1 wherein said channel region is formed by ion implantation and annealing.

10. The method of claim 9 wherein a sacrificial oxide layer is formed on the Si-containing layer prior to said ion implantation.

11. The method of claim 1 wherein said sacrificial spacers have a width of from about 50 to about 100 nm.

12. The method of claim 1 wherein said undercutting shallow trench isolation regions are formed by the steps of: chemical etching, isotropic reactive ion etching, oxidation and a second isotropic etch.

13. The method of claim 1 wherein said sacrificial spacers are removed utilizing a chemical etchant.

14. The method of claim 1 wherein said gate spacers are formed by deposition and etching.

15. The method of claim 1 wherein said source/drain regions are formed by ion implantation and annealing using the gate spacers as an implant mask.

16. The method of claim 1 further comprising forming raised source/drain regions on said source/drain regions, said raised source/drain regions are formed by deposition of an epi-Si or Si layer and ion implantation and annealing.

17. The method of claim 16 further comprising forming suicide regions on said raised source/drain regions.

18. The method of claim 17 further comprising forming an insulating layer having conductively filled contact holes atop the structure.

19. A method of fabricating a semiconductor device comprising the steps of:
providing a structure comprising a carrier wafer, an oxide layer positioned on the carrier wafer, a polySi back-gate located on the oxide layer, a back-gate dielectric located on said polySi back-gate, and a Si-containing layer located on said back-gate dielectric;
forming a channel region into a portion of said Si-containing layer;
forming a front gate region comprising a front-gate dielectric, a front polySi gate and sacrificial spacers atop said channel region;
forming undercutting shallow trench isolation regions in said structure by the steps of chemical etching, isotropic reactive ion etching, oxidation and a second isotropic etch;
removing the sacrificial spacers and forming source/drain extensions into the channel region; and
forming gates spacers atop the top of the channel region and source/drain regions in said channel region, wherein said polySi back-gate is self-aligned with the front polySi gates and the source/drain extensions.

* * * * *

UNITED STATES PATENT AND TRADEMARK OFFICE
CERTIFICATE OF CORRECTION

PATENT NO. : 7,018,873 B2 Page 1 of 1
APPLICATION NO. : 10/639942
DATED : March 28, 2006
INVENTOR(S) : Hussein I. Hanafi et al.

It is certified that error appears in the above-identified patent and that said Letters Patent is hereby corrected as shown below:

On the title page item 57) Abstract, line 1
"provides SOI CMOS"

should read

--The present invention provides SOI CMOS --

Column 11, Line 19, Claim 17:
"forming suicide" should read -- forming silicide --

Column 12, Line 20, Claim 19:
"polySi gates and the" should read -- polySi gate and the --

Signed and Sealed this

Eighth Day of August, 2006

JON W. DUDAS
*Director of the United States Patent and Trademark Office*